(12) United States Patent
Sahara et al.

(10) Patent No.: US 7,132,341 B2
(45) Date of Patent: Nov. 7, 2006

(54) SEMICONDUCTOR INTEGRATED CIRCUIT DEVICE AND THE PROCESS OF THE SAME

(75) Inventors: Masashi Sahara, Hitachinaka (JP);
Fumiaki Endo, Hitachinaka (JP);
Masanori Kojima, Fussa (JP);
Katsuhiro Uchimura, Koganei (JP);
Hideaki Kanazawa, Hitachinaka (JP);
Masakazu Sugiura, Hitachi (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 7 days.

(21) Appl. No.: 09/974,814

(22) Filed: Oct. 12, 2001

(65) Prior Publication Data
US 2002/0048947 A1   Apr. 25, 2002

(30) Foreign Application Priority Data
Oct. 20, 2000   (JP)   ............................ 2000-320572

(51) Int. Cl.
*H01L 21/336* (2006.01)
*H01L 21/44* (2006.01)

(52) U.S. Cl. ........................ 438/303; 438/655; 438/682

(58) Field of Classification Search ................ 438/299, 438/301, 586, 592, 649, 651, 655, 682, 683, 438/303, 304
See application file for complete search history.

(56) References Cited

U.S. PATENT DOCUMENTS

| 5,344,793 | A | * | 9/1994 | Zeininger et al. | ........... | 438/682 |
| 5,780,929 | A |   | 7/1998 | Zeininger et al. |           |         |
| 6,096,638 | A | * | 8/2000 | Matsubara        | ................... | 438/649 |
| 6,117,723 | A | * | 9/2000 | Huang            | ........................ | 438/238 |
| 6,239,006 | B1 | * | 5/2001 | Shields          | ........................ | 438/585 |
| 6,303,503 | B1 | * | 10/2001 | Kamal et al.    | ................ | 438/682 |

FOREIGN PATENT DOCUMENTS

| EP | 0 325 328 A1 | * | 7/1989 |
| JP | 7-161660 |   | 6/1995 |
| JP | 9-320987 |   | 12/1997 |

OTHER PUBLICATIONS

Wolf, S., Silicon Processing for the VLSI Era, vol. 2, Lattice Press, 1990, pp. 150-152.*
Hong, Q., et al., CoSi2 with Low Diode Leakage . . . , IEDM Tech. Digest, Dec. 1997, pp. 107-110.*
Rho, K., et al., Dependence of Deep Submicron CMOSFET Characteristics . . . , International Conference of Microelectronics and VLSI, Nov. 1995, pp. 291-294.*

(Continued)

*Primary Examiner*—T. N. Quach
(74) *Attorney, Agent, or Firm*—Antonelli, Terry, Stout and Kraus, LLP.

(57) ABSTRACT

In a high-performance semiconductor integrated circuit, the standby current is reduced by preventing current leakage in a semiconductor integrated circuit device, for example, the memory cell of an SRAM. A gate electrode G is formed on semiconductor substrate 1 and n$^+$-type semiconductor regions 17 (source/drain regions) are formed in the semiconductor substrate on both sides of this gate electrode. Within the same apparatus and under near-vacuum conditions, a depth of 2.5 nm or less is etched away from the surfaces of the source/drain regions and gate electrode, a film of Co is then formed on the source/drain regions, and thermal processing is applied to form $CoSi_2$ layer 19*a*. As a result, current leakage in the memory cell can be prevented and this method can be applied to semiconductor integrated circuit devices that have low current consumption or are battery-driven.

27 Claims, 11 Drawing Sheets

OTHER PUBLICATIONS

Yan, R., et al., High Performance 0.1 um Room Temperature Si MOSFETs, Symposium on VLSI Digest of Technical Papers, 1995, pp. 86-87.*

Lee, S., et al., A High Performance 0.13 um CMOS Process . . . , IEEE 6th International Conference of VLSI and CAD, Oct. 1999, pp. 136-139.*

* cited by examiner

SEMICONDUCTOR INTEGRATED CIRCUIT DEVICE AND THE PROCESS OF THE SAME

BACKGROUND OF THE INVENTION

The present invention is directed to a semiconductor integrated circuit device and to the method of its fabrication; and, more particularly, the invention is directed to a technology that is effective for application to semiconductor integrated circuit devices with low levels of current consumption, such as a SRAM (static random access memory).

An SRAM with memory cells composed of six MISFETs is used in a cache memory for personal computers or workstations.

An SRAM is composed of a flip-flop circuit that stores one bit of data and of two MISFETs (metal insulator semiconductor field effect transistors) for the transfer of data. The flip-flop circuit is configured, for example, as a pair of driver MISFETs and a pair of load MISFETs.

In these MISFETs, a silicide layer is formed on the source/drain regions to decrease the resistance of the source/drain region and to decrease the contact resistance between the source/drain and a plug that is subsequently to be formed on the source/drain region. At the same time, in these MISFETs, a silicide layer is also formed on the gate electrode to decrease the resistance of the gate electrode (gate wiring).

This silicide layer is formed by depositing a metal layer on the source/drain regions and on the gate electrode and then causing silicidation in the part where the source/drain regions (silicon substrate) and the metal layer come into contact and in the part where the gate electrode (silicon layer) and the metal layer come into contact.

At this time, a technique for etching out the natural oxide on the source/drain regions (silicon substrate) and the gate electrode (silicon layer) prior to deposition of the metal is employed to avoid the agglomeration of silicide. As intended, this keeps the silicide's sheet resistance low.

For example, the Hei. 9-320987 issue of the Patent Laid-Open Official Gazette discloses a technique in which approximately 3 nm to 5 nm is etched away from the surface of a silicon substrate, and then a metal film is deposited and thermally processed to form a silicide layer.

In addition, the Hei. 7-161660 issue of the Patent Laid-Open Official Gazette discloses a technique in which a natural oxide film is removed from the surface of both a silicon substrate and gate polycrystalline silicon by sputter etching using ions of an inert gas, and a Ti film is deposited to form Ti silicide film through thermal processing.

SUMMARY OF THE INVENTION

However, with the miniaturization that accompanies an increase in the degree of integration of memory cells, gate widths decrease and the junction depths of source/drain regions become shallower.

In addition, realization of lower power consumption is required in the semiconductor integrated circuit devices that are used in such mobile products as cellular phones and notebook-sized personal computers, because these semiconductor integrated circuit devices are driven by batteries.

Accordingly, a simple application of the conventional technology involves formation of a deep layer of silicide on the source/drain regions which increases the leakage current between the source/drain regions and the semiconductor's substrate. A detailed explanation of this will be given later.

As a result, the current when standing by (standby current) exceeds a critical value and this reduces the yield of the products. In addition, even when the standby current is less than a critical value, the time over which it is possible to use a battery-driven mobile product is shortened by the inclusion of a semiconductor integrated circuit device that has a large standby current.

The object of this invention is to provide a technique for reducing the standby current by preventing current leakage in a semiconductor integrated circuit device such as the memory cell of an SRAM.

Another object of this invention is to provide a technique to decrease the consumption of current by the memory cells of an SRAM.

The above-described objects and new characteristics will be clarified by the description provided in this specification and the attached drawings.

An outline of an item that typifies the invention disclosed in this application is briefly given in the following explanation.

(1) This invention's method of fabricating a semiconductor integrated circuit device that has a standby current of 5 μA or below in tests of operation at 90° C. and has MISFETs formed on the main surface of a semiconductor substrate includes the steps of: (a) forming a gate-insulating film on said semiconductor substrate; (b) forming a gate electrode by patterning the silicon film deposited on said gate-insulating film; (c) forming the source/drain regions on both sides of said gate electrode by injecting impurities into the semiconductor substrate; (d) sputter-etching away the top of said source/drain regions to 2.5 nm or less below the surface of the regions; (e) then, under near-vacuum conditions and in the same apparatus in which said sputter etching was carried out, forming a metal film on said source/drain regions; (f) forming a metallic silicide layer where said source/drain regions are in contact with said metal film; and (g) removing that part of said metal film which did not react in step (f).

(2) This invention's method of fabricating a semiconductor integrated circuit device that has a standby current of 1.5 μA or below under operational conditions and has MISFETs formed on the main surface of a semiconductor substrate includes the steps of: (a) forming a gate-insulating film on said semiconductor substrate; (b) forming a gate electrode by patterning the silicon film deposited on said gate insulating film; (c) forming the source/drain regions on both sides of said gate electrode by injecting impurities into the semiconductor substrate; (d) sputter-etching away the top of said source/drain regions to 2.5 nm or less below the surface of the regions; (e) then, under near-vacuum conditions and in the same apparatus in which said sputter etching was carried out, forming a metal film on said source/drain regions; (f) forming a metallic silicide layer where said source/drain regions are in contact with said metal film; and (g) removing that part of said metal film which did not react in step (f).

(3) This invention's method of fabricating a semiconductor integrated circuit device that is battery-driven and has MISFETs formed on the main surface of a semiconductor substrate includes the steps of: (a) forming a gate insulating film on said semiconductor substrate; (b) forming a gate electrode by patterning the silicon film deposited on said gate insulating film; (c) forming the source/drain regions on both sides of said gate electrode by injecting impurities into the semiconductor substrate; (d) sputter-etching away the top of said source/drain regions to 2.5 nm or less below the surface of the regions; (e) then, under near-vacuum conditions and in the same apparatus in which said sputter etching was carried out, forming a metal film on said source/drain regions; (f) forming a metallic silicide layer where said source/drain regions are in contact with said metal film; and (g) removing that part of said metal film which did not react in step (f).

(4) A method of fabricating a semiconductor integrated circuit device that has MISFETs formed on the main surface of a semiconductor substrate, includes the steps of: (a) forming a gate-insulating film on said semiconductor substrate; (b) forming a gate electrode with a width of 0.18 μm or less by patterning the silicon film deposited on said gate insulating film; (c) forming the source/drain regions on both sides of said gate electrode by injecting impurities into the semiconductor substrate, (d) sputter-etching away the top of said source/drain regions to 2.5 nm or less below the surface of the regions; (e) then, under near-vacuum conditions and in the same apparatus in which said sputter etching was carried out, forming a metal film on said source/drain regions; (f) forming a metallic silicide layer with a thickness of 20 to 40 nm where said source/drain regions are in contact with said metallic film; and (g) removing said metal film which did not react in step (f).

(5) A method of fabricating a semiconductor integrated circuit device having MISFETs formed on the main surface of a semiconductor substrate, includes the steps of: (a) forming a gate insulating film on said semiconductor substrate; (b) forming a gate electrode with a width of 0.18 μm or below by patterning the silicon film deposited on said gate insulating film; (c) forming the source/drain regions on both sides of said gate electrode by injecting impurities into the semiconductor substrate, (d) sputter-etching away the top of said source/drain regions to 2.5 nm or less below the surface of the regions; (e) then, under near-vacuum conditions and in the same apparatus in which said sputter etching was carried out, forming a metal film on said source/drain regions; (f) forming a metallic silicide layer with sheet resistance of 5Ω/□ to 12Ω/□ where said source/drain regions are in contact with said metal film; and (g) removing said metal film which did not react in step (f).

Since a depth of 2.5 nm or less is sputter-etched away from the surface of said source/drain regions prior to the formation of the film of metallic silicide, this method is able to form a semiconductor integrated circuit device with a low leakage current.

In addition, forming a metallic silicide film on the gate electrode after sputter-etching away its surface to a depth of 2.5 nm or less can prevent disconnection of the metallic silicide on the gate electrode.

DETAILED DESCRIPTION OF THE PREFERRED EMBODIMENT

This invention is described in detail below on the basis of an embodiment shown in accompanying drawings. Identical numerical references that describe the embodiment in the figures refer to the same items and the descriptions of these items are not repeated.

Figure 1:
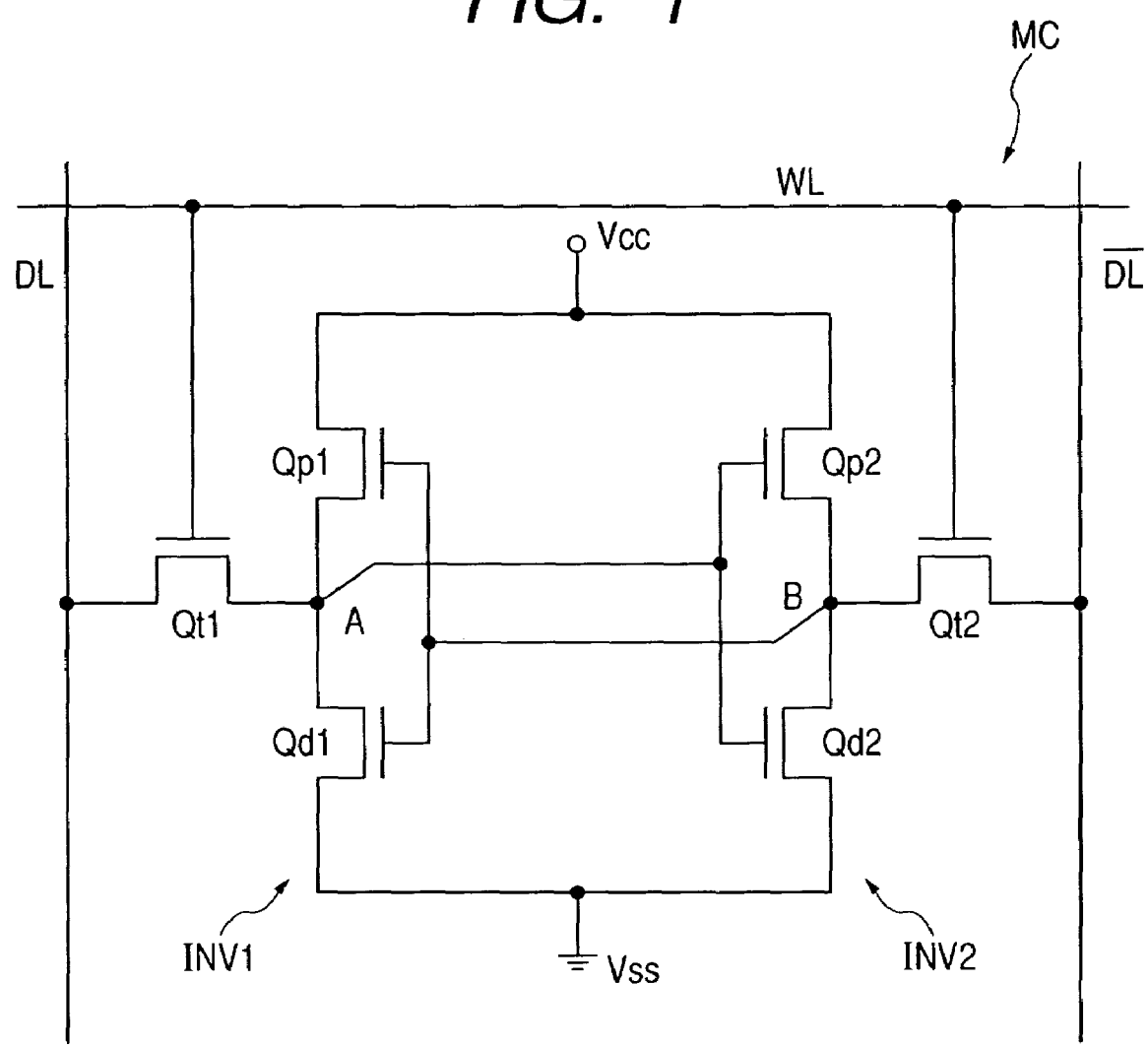
FIG. 1 is an equivalent circuit diagram of a memory cell of an SRAM, which represents one embodiment of this invention.

FIG. 1 is an equivalent circuit diagram showing the memory cell for SRAM that is this embodiment. As is shown, this memory cell MC is placed in the intersection of a pair of complementary data lines (data lines DL and /DL) and word line WL, and is composed of a pair of driver MISFETs Qd1 and Qd2, a pair of load MISFETs Qp1 and Qp2, and a pair of transfer MISFETs Qt1 and Qt2. Driver MISFETs Qd1 and Qd2 and transfer MISFETs Qt1 and Qt2 are n-channel MISFETs and load MISFETs Qp1 and Qp2 are p-channel MISFETs.

Of said six MISFETs that configure memory cell MC, driver MISFET Qd1 and load MISFET Qp1 configure CMOS inverter INV1 and driver MISFET Qd2 and load MISFET Qp2 configure CMOS inverter INV2. Shared input/output pins (storage nodes A and B) of this pair of CMOS inverters INV1 and INV2 are cross-coupled to configure a flip-flop circuit as the data storage part for storing one bit of data. In addition, one input/output pin (storage node A) of this flip-flop circuit is connected to either the source or drain region of transfer MISFET Qt1 and the other input/output pin (storage node B) is connected to either the source or drain region of transfer MISFET Qt2.

Furthermore, the other of the source/drain regions of transfer MISFET Qt1 is connected to data line DL and the other of the source/drain regions for transfer MISFET Qt2 is connected to data line /DL. Furthermore, one end of the flip-flop circuit (the source regions of load MISFETs Qp1 and Qp2) is connected to the power-supply voltage (Vcc) and the other end (the source regions of driver MISFETs Qd1 and Qd2) is connected to a reference voltage (Vss).

To describe the operation of said circuit, when storage node A of CMOS inverter INV1 is at its high level of voltage ("H"), driver MISFET Qd2 is switched on, so storage node B of other CMOS inverter INV2 is switched to its low level of voltage ("L"). Accordingly, driver MISFET Qd1 is switched off and the high level of voltage ("H") on storage node A is retained. That is, the states of mutual storage nodes A and B are retained by a latch circuit in which the paired CMOS inverters INV1 and INV2 are cross-linked and the data is retained as long as the power supply voltage is applied.

Word line WL is connected to the gate electrodes of both transfer MISFETs Qt1 and Qt2 and the ON/OFF signals for transfer MISFETs Qt1 and Qt2 are controlled by this word line WL. That is, when word line WL is set to its high level of voltage ("H"), transfer MISFETs Qt1 and Qt2 are switched on, so the flip-flop circuit and complementary data lines (data lines DL and /DL) are electrically connected. The potential states ("H" or "L") of storage nodes A and B are thus made to appear on data lines DL and /DL to be read as data in memory cell MC.

To write data to memory cell MC, the data on data lines DL and /DL is transmitted to storage nodes A and B while word line WL is set to "H" potential level and transfer MISFETs Qt1 and Qt2 are kept on.

Next, FIGS. 2 to 8 will be used in describing the method of fabricating this embodiment in the form of SRAM.

Of the six MISFETs (Qt1, Qt2, Qd1, Qd2, Qp1, and Qp2) that configure memory cell MC, the n-channel MISFETs (Qt1, Qd1, Qt2, and Qd2) are formed in p-type well 3 and the p-channel MISFETs (Qp1 and Qp2) are formed in n-type well 4.

An isolating element is used to divide a p-type well from an n-type well or to isolate elements within either well area. This isolating element is formed in the following way. For example, semiconductor substrate 1, made up of p-type single-crystalline silicon having a resistivity of approximately 1 to 10 $\Omega$cm, is etched to form an isolating-element trench with a depth of approximately 250 nm.

Next, a film of silicon dioxide is deposited by CVD (chemical vapor deposition) on semiconductor substrate 1, including inside the trench, to a thickness of approximately 450 to 500 nm. The silicon dioxide film in the upper part of the trench is polished by CMP (chemical mechanical polishing) to flatten its surface.

Next, p-type impurities (boron) and n-type impurities (for example, phosphorous) are ion-implanted and said impurities are then diffused by thermal processing at approximately 1000° C. to form the above described p-type well 3 and n-type well 4. Hereafter, the steps used to form the MISFETs on these wells 3 and 4 is described. However, the six MISFETs (Qt1, Qt2, Qd1, Qd2, Qp1, and Qp2) are formed in the same manner, so the description will be given with n-channel MISFET Qd1 as a representative.

Figure 2:
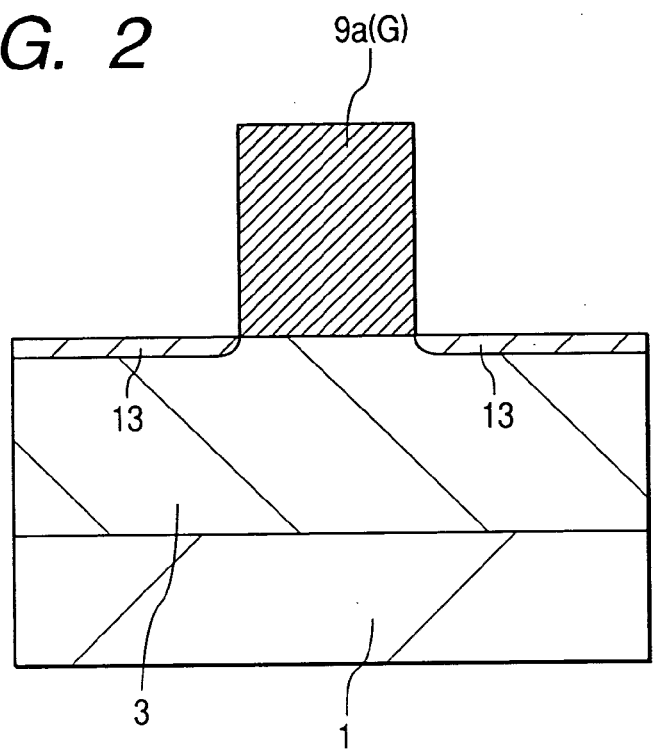
FIG. 2 is a cross-sectional view through the key parts of a semiconductor substrate showing a step in the method for fabricating a semiconductor integrated circuit device, according to one embodiment of this invention.

Firstly, as is shown in FIG. 2, the surface of semiconductor substrate 1 (p-type well 3) is wet-cleaned using hydrofluoric acid as the cleaning agent and a clean gate-oxide film (not illustrated) is then formed with a thickness of approximately 3 nm on the surface of p-type well 3 by thermal oxidation at approximately 800° C.

Next, film of low-resistance polycrystalline silicon 9a is deposited by CVD to a thickness of approximately 250 nm on the gate-oxide film. Next, gate electrode G is formed by using a film of photoresist (not illustrated) as a mask in dry-etching film of polycrystalline silicon film 9a. The width of this gate electrode is approximately 0.18 µm.

Next, n-type impurities (phosphorous) are injected into both sides of gate electrode G on p-type well 3 to form $n^-$-type semiconductor region 13. The junction depth of this $n^-$-type semiconductor region 13 is approximately 50 nm. Here, the junction depth of $n^-$-type semiconductor region 13 refers to the distance from the surface of semiconductor substrate 1 to the position where it becomes p-type conductive.

Figure 3:
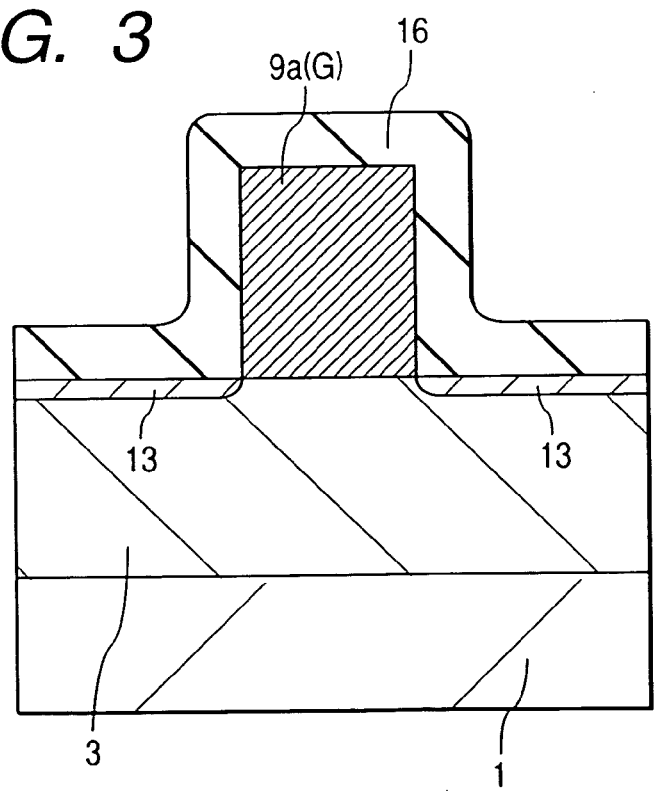
FIG. 3 is a cross-sectional view through the key parts of a semiconductor substrate showing a step in the method for fabricating a semiconductor integrated circuit device, according to one embodiment of this invention.
Figure 4:
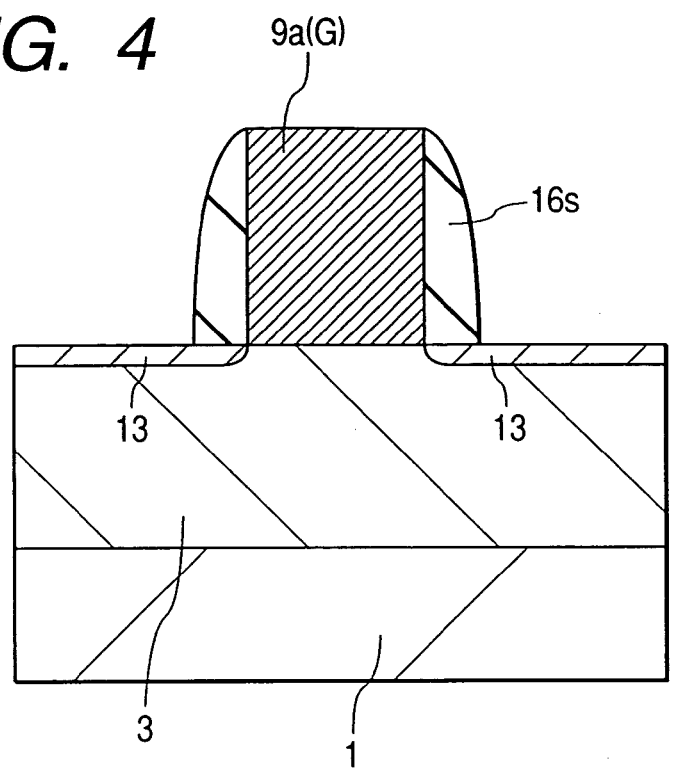
FIG. 4 is a cross-sectional view through the key parts of a semiconductor substrate showing a step in the method for fabricating a semiconductor integrated circuit device, according to one embodiment of this invention.

Next, as is shown in FIG. 3, silicon dioxide film 16 is deposited by CVD to a thickness of approximately 100 nm on semiconductor substrate 1. This is followed by anisotropic etching to form side-wall spacer 16s on the side surfaces of gate electrode G (FIG. 4).

Figure 5:
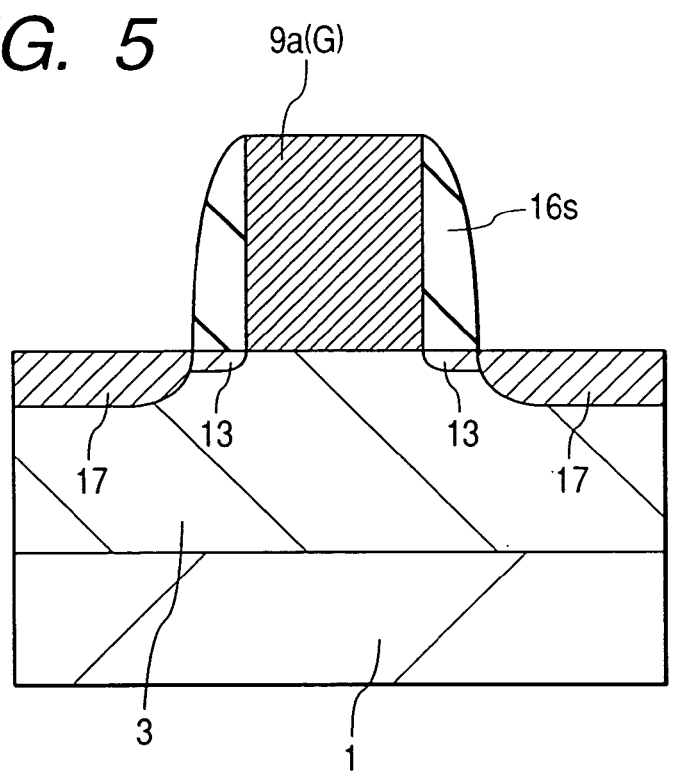
FIG. 5 is a cross-sectional view through the key parts of a semiconductor substrate showing a step in the method for fabricating a semiconductor integrated circuit device, according to one embodiment of this invention.

Next, as is shown in FIG. 5, n-type impurities (phosphorous or arsenic) are ion-implanted into p-type well 3 to form $n^+$-type semiconductor region 17 (source and drain). The junction depth of this region of $n^+$-type semiconductor 17 (source and drain) is approximately 150 nm. Here, the junction depth of $n^+$-type semiconductor region 17 (source and drain) refers to the distance from the surface of semiconductor substrate 1 to the position where it becomes p-type conductive.

Figure 8:
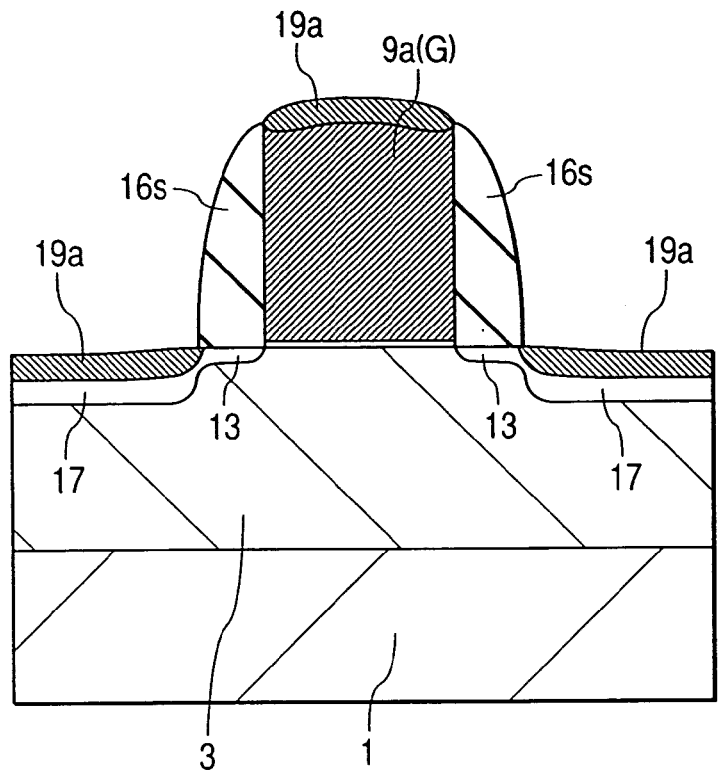
FIG. 8 is a cross-sectional view through the key parts of a semiconductor substrate showing a step in the method for fabricating a semiconductor integrated circuit device, according to one embodiment of this invention.

Next, $CoSi_2$ layer 19a with a sheet resistance of 5 to 12$\Omega$ is formed to a thickness of 20 to 40 nm on the exposed part ($n^+$-type semiconductor region 17) of semiconductor substrate 1 and gate electrode G (see FIG. 8). The surface of semiconductor substrate 1 is cleaned and sputter-etched before this $CoSi_2$ layer 19a is formed. This step will be described below in detail.

Firstly, hydrofluoric acid is used as the agent in cleaning the surface of semiconductor substrate 1. Contamination and the natural oxide film on the surface of semiconductor substrate 1 are removed to some extent.

Figure 6:
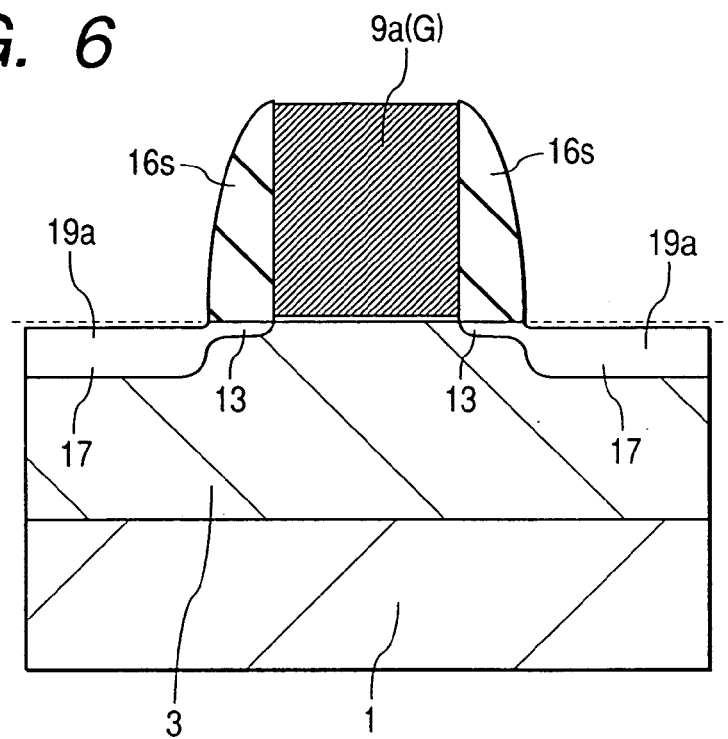
FIG. 6 is a cross-sectional view through the key parts of a semiconductor substrate showing a step in the method for fabricating a semiconductor integrated circuit device, according to one embodiment of this invention.

Next, as is shown in FIG. 6, argon sputter etching is used to etch a depth of 2.5 nm or less away from the surface of semiconductor substrate 1. As a result, the exposed section of semiconductor substrate 1 ($n^+$-type semiconductor region 17) and the top of gate electrode G are recessed. FIG. 6 is a magnified drawing where an n-channel MISFET Qd1 is being formed.

This sputter-etching can remove contamination and natural oxide film on the exposed section ($n^+$-type semiconductor region 17 and $p^+$-type semiconductor region 18) of semiconductor substrate 1 and on gate electrode G. Here, the given amount of sputter-etching is the equivalent value for a film of silicon dioxide. That is, for example, 1.5 µm of sputter etching means that semiconductor substrate 1 is etched under the same conditions that would etch away 1.5 µm of a film of silicon dioxide. To make the description easily understood, the depth of etching of the surface of semiconductor substrate 1 ($n^+$-type semiconductor region 17) depicted in FIG. 6 is somewhat exaggerated. Therefore, the ratio of the depth etched away to other dimensions such as the thickness of the gate electrode G is not the real ratio.

Figure 7:
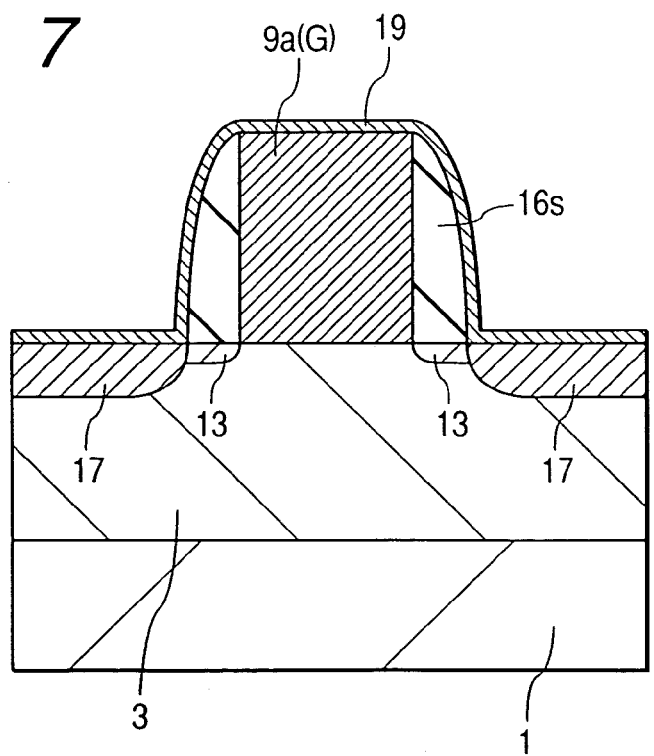
FIG. 7 is a cross-sectional view through the key parts of a semiconductor substrate showing a step in the method for fabricating a semiconductor integrated circuit device, according to one embodiment of this invention.

Next, as shown in FIG. 7, Co film 19 is deposited by sputtering. The sputter-etching described above and the deposition of this Co film 19 take place as sequential processes in a multi-chambered vacuum system. Specifically, sputter etching is carried out in one chamber in which the pressure of the remaining gas is $10^{-4}$ to $10^{-6}$ Pa. The semiconductor substrate 1, is then moved to another chamber in which the pressure of the remaining gas is $10^{-3}$ Pa or lower, and finally the film of Co is deposited under conditions where the pressure of the remaining gas is $10^{-4}$ to $10^{-6}$ Pa. Here, the amount etched away from teh surface of semiconductor substrate 1 is so small that we omit its depiction in FIG. 7.

Next, thermal processing is applied for one minute at 500 to 550° C. A silicide layer is thus generated, i.e., silicidation occurs where semiconductor substrate 1 ($n^+$-semiconductor region 17) and Co film 19 come into contact and where gate electrode G and Co film 19 come into contact.

Next, as shown in FIG. 8, the Co film which did not react is removed by etching leaving $CoSi_2$ layer 19a on semiconductor substrate 1 ($n^+$-type semiconductor region 17) and gate electrode G. Next, thermal processing at 700 to 850° C. is applied for approximately one minute to decrease the resistance of the $CoSi_2$ layer 19a. FIG. 8 is a magnified view of the region where n-channel MISFET Qd1 has been formed. To make the description more easily understood, the depth of etching of the surface of semiconductor substrate 1 depicted in FIG. 8 is somewhat exaggerated. Therefore, the ratio of the depth etched away to other dimensions, such as the thickness of the gate electrode G, is not the real ratio.

According to this embodiment, the depth of 2.5 nm or less is etched away from the surface of semiconductor substrate 1, and the Co film 19 is then deposited to form a $CoSi_2$ layer 19a. This can reduce the standby current.

Figure 9:
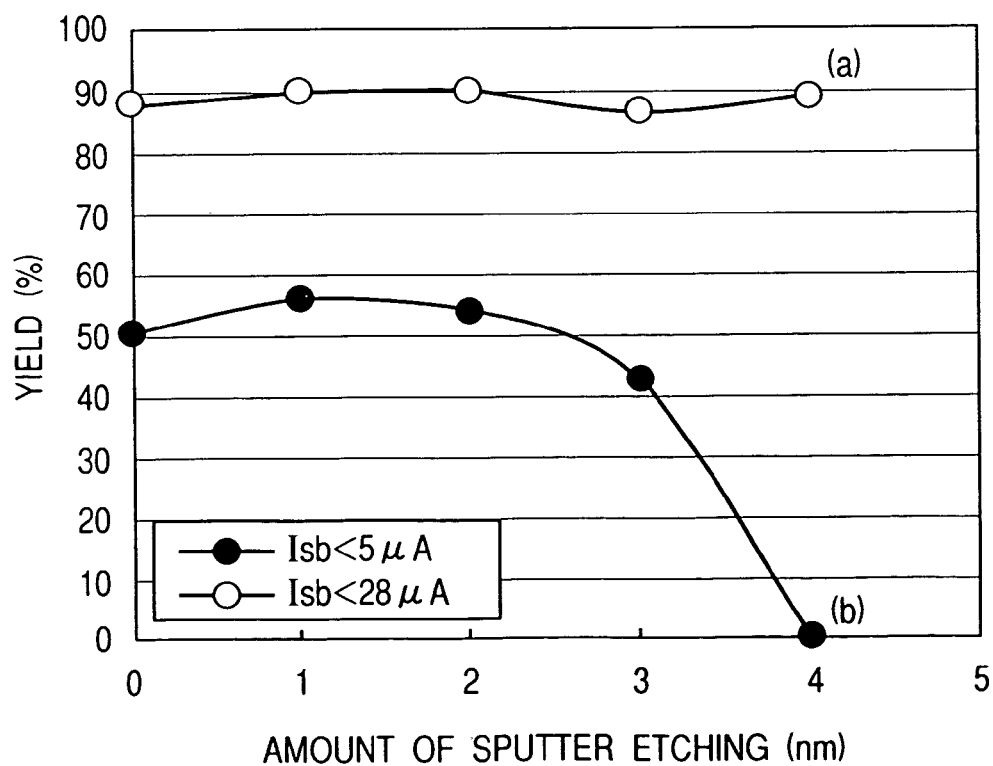
FIG. 9 is a graph that shows the relationship between the amount of sputter etching and yield.

FIG. 9 is a graph showing a first set of data to indicate the relationship between the amount of sputter etching and the yield of products. As shown in line (a) of FIG. 9, a yield of approximately 90% can be ensured by any amount of sputter etching fro among 0, 1, 2, 3 or 4 nm when the critical value of the standby current (Isb) is set to 28 .A or less.

However, when the critical value of the standby current (Isb) is set to 5 .A or below, as shown in line (b), the yield is improved when the amount of sputter etching is 1 or 2 nm, as compared with the case where no sputter etching is carried out (the amount of sputter etching is 0). Nevertheless, when the amount of sputter etching is 3 or 4 nm, the yield becomes lower than in the case where no sputter etching is carried out (the amount of sputter etching is 0). The yield dropped to approximately zero when the amount of sputter etching was 4 nm.

It becomes clear that a semiconductor integrated circuit device for which the amount of sputter etching is 3 nm or above cannot be adopted for use in products featuring a low consumption of current that have a critical value for standby current (Isb) of 5 µA or less.

In this embodiment, however, the amount of sputter etching is 2.5 nm or less, so that a better yield can be ensured than in the case where no sputter etching is carried out even when the critical value of the standby current (Isb) is set to 5 µA or less.

Here, the standby current refers to the current which flows when the device is operating under test conditions at 90° C. The standby current in practical use (at normal temperatures) is, however, approximately 1 to 1.5 µA.

Figure 10:
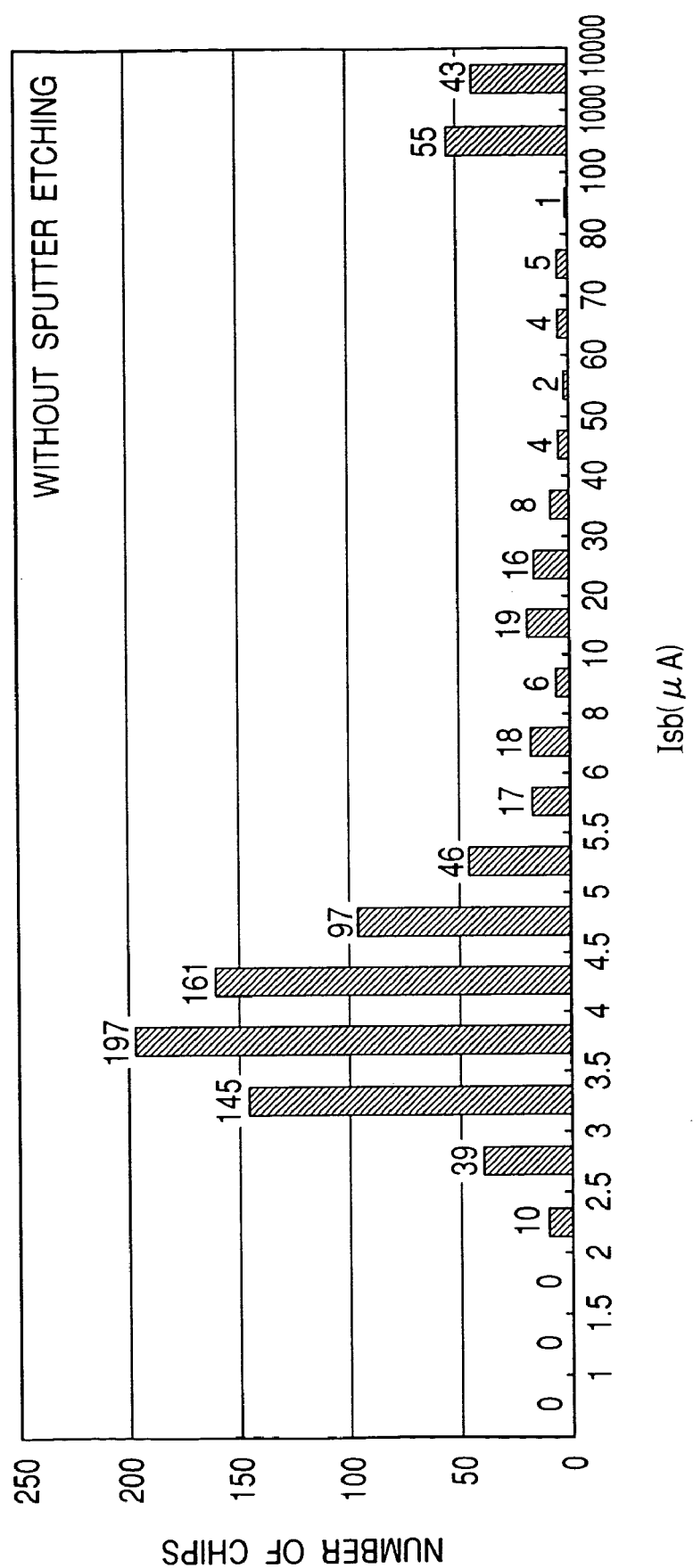
FIG. 10 is a graph that shows the relationship between the standby current and number of chips when the amount of sputter etching is 0.
Figure 11:
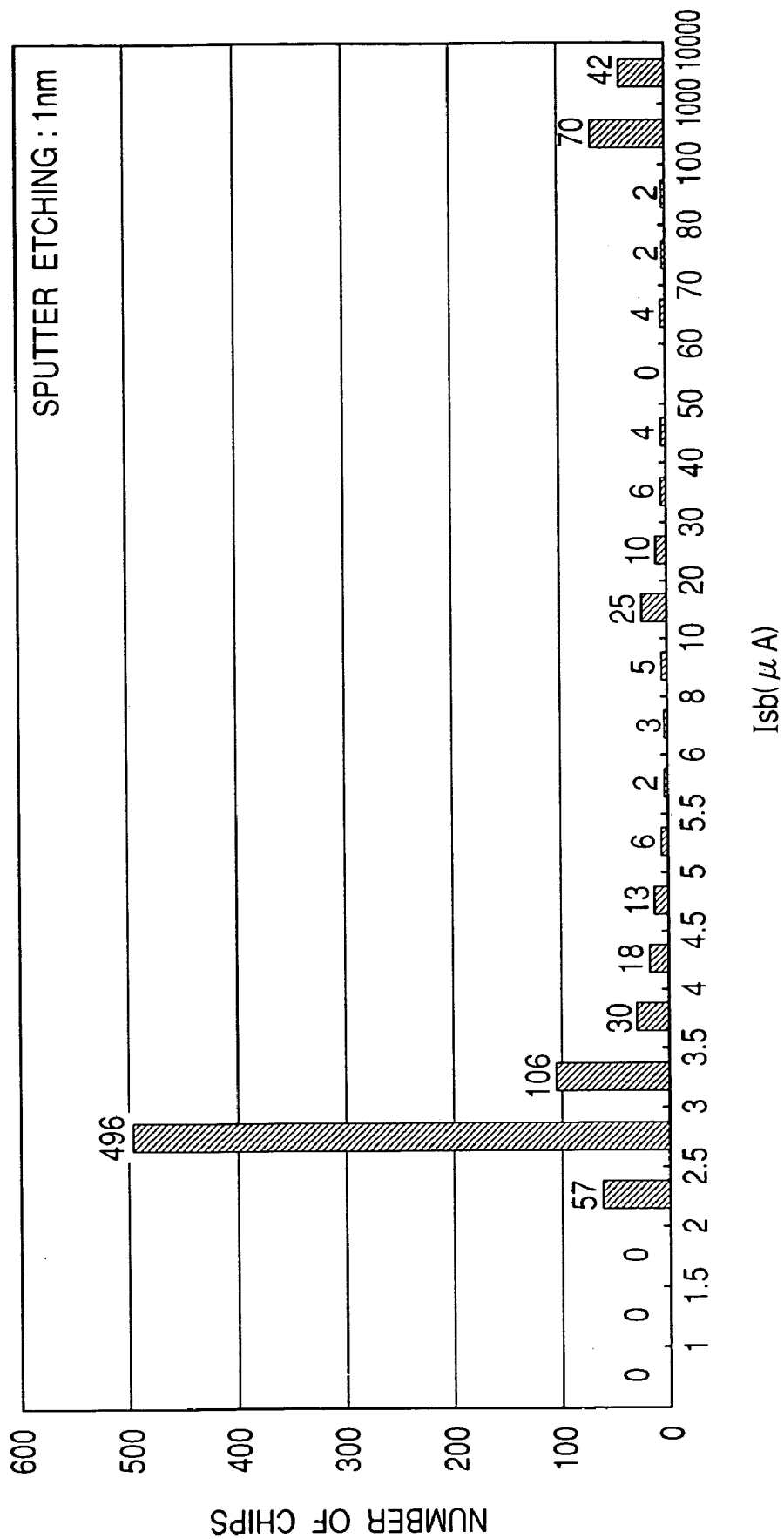
FIG. 11 is a graph that shows the relationship between the standby current and number of chips when the amount of sputter etching is 1 nm.
Figure 12:
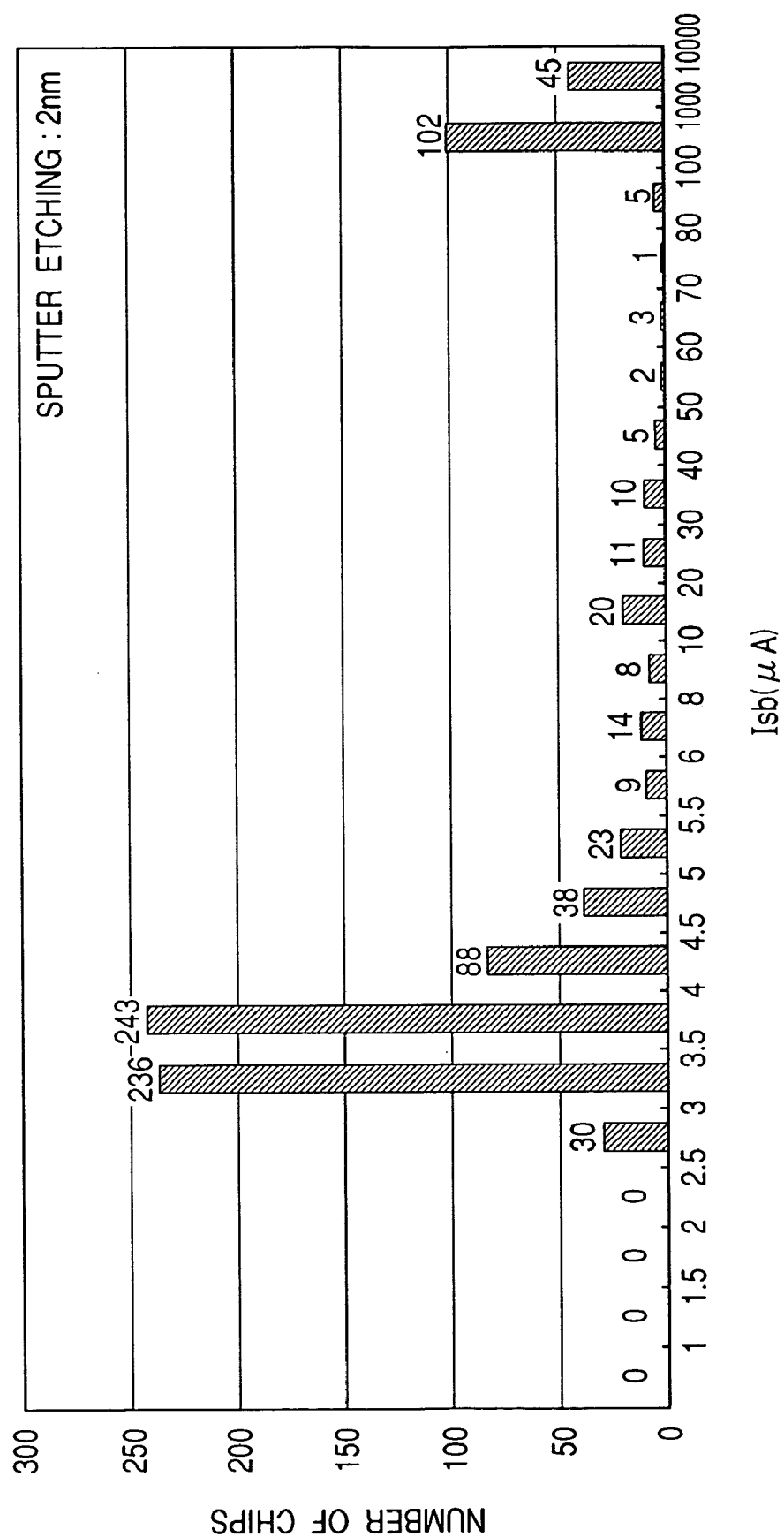
FIG. 12 is a graph that shows the relationship between the standby current and number of chips when the amount of sputter etching is 2.5 nm.
Figure 13:
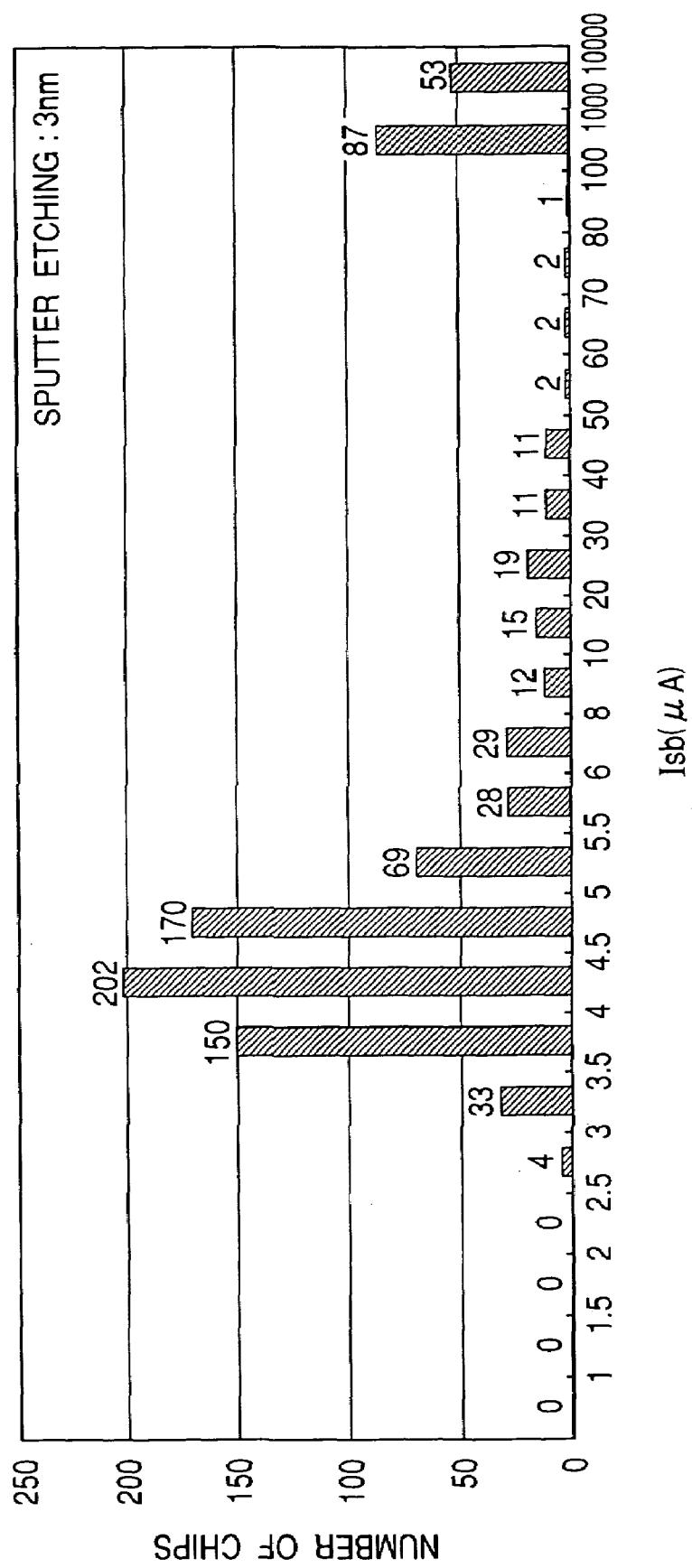
FIG. 13 is a graph that shows the relationship between the standby current and number of chips when the amount of sputter etching is 3 nm.

Next, a second set of data will be described. This data shows the relationship between the value of standby current Isb (µA) and the number of good chips when the amount of sputter etching is 0, 1, 2, and 3 nm (FIGS. 10 to 13 respectively). When no sputter etching is carried out (when the amount of sputter etching is 0), there are 197 chips with standby current flows of 3.5 to 4 µA. This is depicted in FIG. 10. When the amount of sputter etching is 1 nm, there are 496 chips with standby current flows of 2.5 to 3 µA. This is depicted in FIG. 11. When the amount of sputter etching is 2 nm, there are 243 chips with standby current flows of 3.5 to 4 µA and next to this are 236 chips with standby current flows of 3 to 3.5 µA. This is depicted in FIG. 12. When the amount of sputter etching is 3 nm, there are 202 good chips with its standby current of 4 to 4.5 µA. This is depicted in FIG. 13. The greater the amount of sputter etching, the greater the number of chips with large flows of standby current that appear.

The smaller the standby current, the better the performance of a chip, and this is so even among chips with standby current levels that satisfy the 5-µA critical value for standby current. Consequently, when the amount of sputter etching is set to 2.5 nm or less, more chips with lower levels of standby current can be obtained, hence more chips with high levels of performance can be obtained.

As described above, with this embodiment, it is possible to reduce the standby current of the semiconductor integrated circuit device and to reduce its consumption of current. As a result, these semiconductor integrated circuit devices are applicable in cellular phones and personal computers which are battery-driven, since they are able to lengthen the times over which these products are used.

Next, the reasons for this ability to reduce the standby current will be described.

With this invention, the surface of semiconductor substrate 1 is etched to a depth of 2.5 nm or less by sputter etching, which removes contamination and the natural oxide film on the surface of semiconductor substrate 1. This film of natural oxide can be considered to be approximately 1-nm thick.

Figure 14:
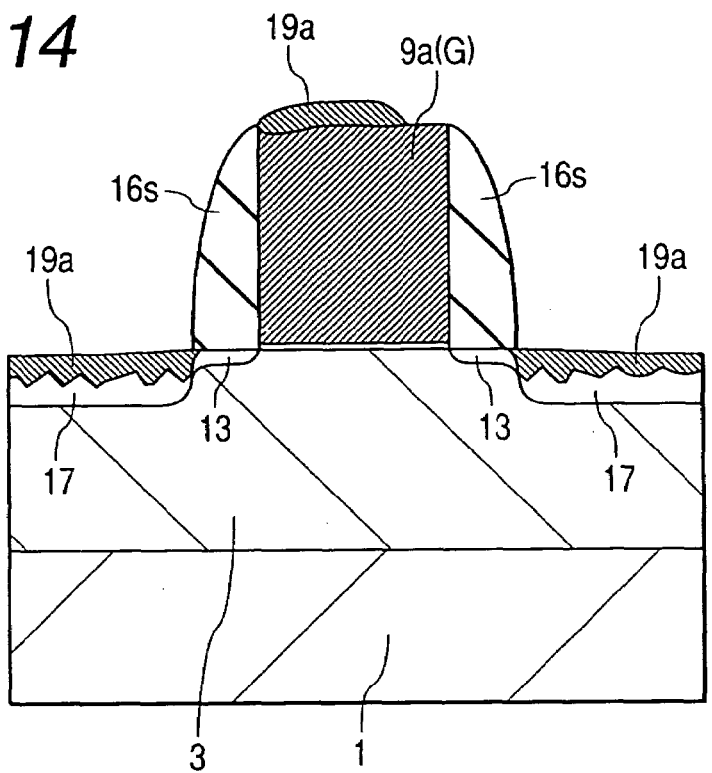
FIG. 14 is a cross-sectional view through the key parts of a semiconductor substrate and is used to describe the advantages of this invention.

As a result, the layer of metallic silicide ($CoSi_2$ 19a) which is formed has a smooth bottom and fewer irregularities, so the film's thickness becomes uniform. When, on the contrary, sputter etching is not carried out, the thickness of the silicide layer varies according to the amount of contamination or of natural oxide film on semiconductor substrate 1, which causes a rough surface at the bottom of the silicide layer, as shown in FIG. 14.

On the other hand, as was described earlier, the junction depth becomes shallower as the miniaturization of memory cells proceeds.

Consequently, when the bottom of the layer of metallic silicide is uneven, part of the layer of metallic silicide may approach, or even penetrate, the junction, which causes current leakage.

In particular, current leakage readily occurs in a semiconductor integrated circuit device that has a junction depth of approximately 50 to 150 nm, as is the case with this embodiment.

This also decreases the yield in the fabrication of a semiconductor integrated circuit device, to be used for a battery-driven product, that has a critical value for standby current of 5 µA or less.

Figure 15:
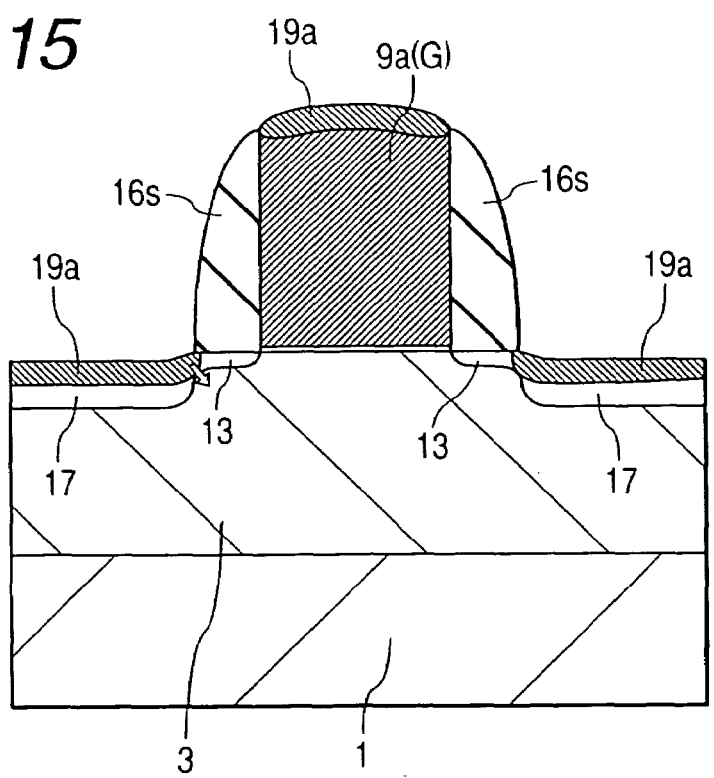
FIG. 15 is a cross-sectional view through the key parts of a semiconductor substrate and is used to describe the advantages of this invention.

FIG. 15 illustrates the case where there is excessive sputter etching. The surface of semiconductor substrate 1 is etched more deeply, so that the metallic silicide layer approaches the junctions of the source/drain regions. This increases the leakage current.

Making a thinner layer of metallic silicide is one possible option for preventing an increase in the leakage current, but this, in turn, makes it difficult to obtain the required sheet resistance (5 to 12Ω/□ in this embodiment).

Figure 16:
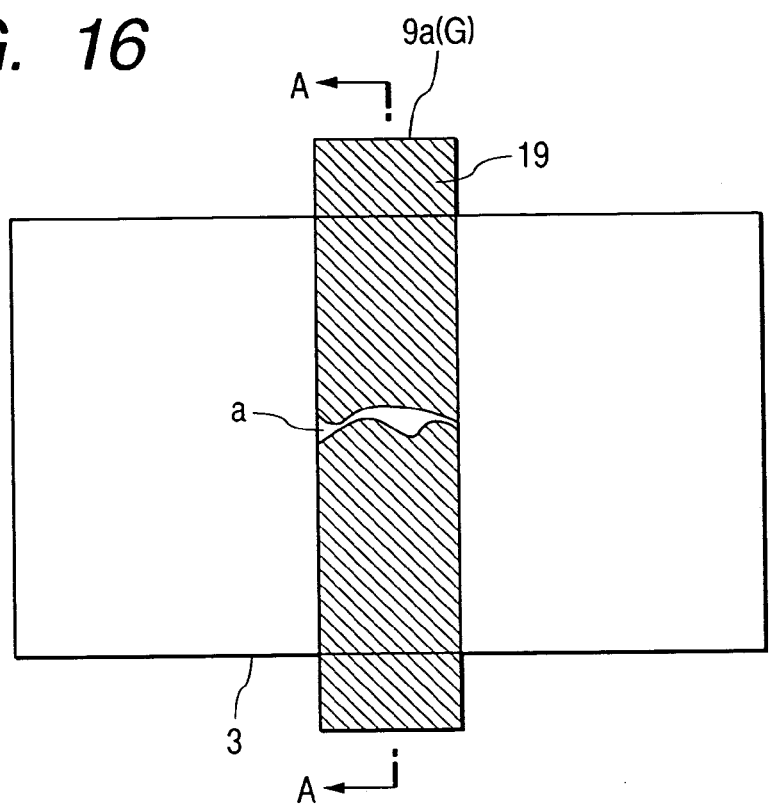
FIG. 16 is a top plan view of the surface of a semiconductor substrate and is used to describe the advantages of this invention.

On the other hand, the layer of metallic silicide is also formed on the gate electrode where it plays the role of decreasing the resistance of the gate electrode. Therefore, when the layer of metallic silicide is made thinner, the agglomeration of metallic silicide occurs more readily and, as shown in FIG. 14, region, in which no metallic silicide layer is formed, appears. In addition, a discontinuity of the layer of metallic silicide sometimes occurs, as is shown in FIG. 16. FIG. 16 is a view of the top surface of the substrate after a thin metallic silicide layer has been formed.

When a region with no metallic silicide layer or with a discontinuity appears, the resistance of the gate electrode layer increases. This slows the operating speed. As a result, it is not possible for the functions of the memory cell to be carried out within the required period of operation, and this constitutes a failure.

However, in this embodiment, a depth of 2.5 nm or less is etched away from the surface of semiconductor substrate 1, the thickness of the layer of metallic silicide (20 to 40 nm in this embodiment) can thus be ensured, and this can prevent such discontinuities as are caused by the uneven interdiffusion of the layer of metallic silicide.

Figure 17:
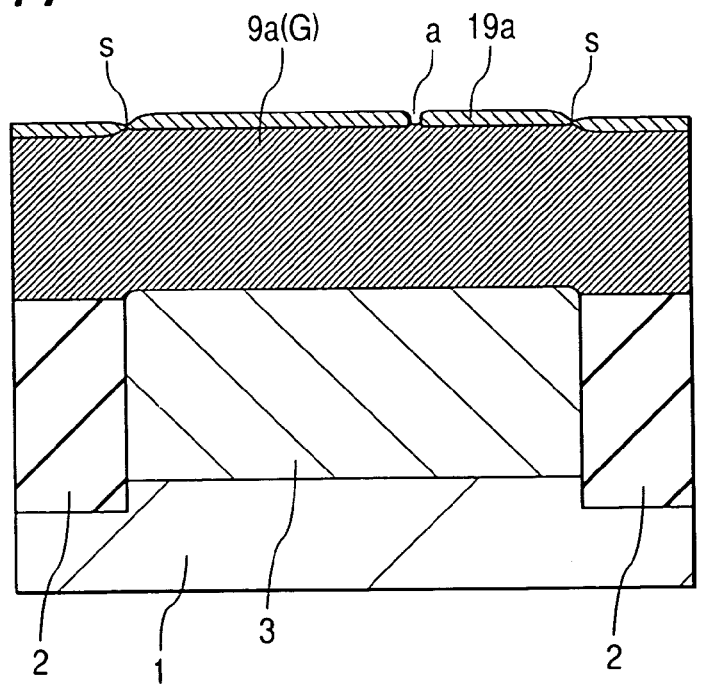
FIG. 17 is a drawing used to describe the advantages of this invention.

In addition, in this embodiment, the surface of the gate electrode is also etched away to a depth of 2.5 nm or less at the same time that the surface of semiconductor substrate 1 is etched, so that it is possible to reduce the height of the steps due to the isolating element. This can prevent discontinuities in the layer of metallic silicide. That is, as shown in FIG. 17, which is a cross-sectional view taken along line A—A of FIG. 16, a step appears as the so-called recess etc., at the end of isolation element 2. When a gate electrode is formed on this step, step s is carried over on the gate electrode. The layer of metallic silicide is thinner on this step, so a discontinuity as described above is more easily generated. However, if sputter etching is carried out as in this embodiment, this step is reduced. This can prevent the discontinuities of the metallic silicide layer.

In addition, with this embodiment, contamination and the natural film of oxide can be removed from the surface of the gate electrode. The quality of the metallic silicide layer can be improved and a uniform film can be formed.

In this embodiment, as the thickness of the layer of the metallic silicide layer on the gate electrode thus can be ensured, and discontinuities of the metallic silicide layer can be prevented, the yield of products can be improved.

In the process as described to this point, the n-channel MISFET Qd1 that is a constituent of memory cell MC has been completed. As described above, the other n⁻-channel MISFETs (Qt1, Qt2, Qd1, and Qd2) are formed by following the same steps, so that the description thereof is omitted. The steps by which the p-channel MISFETs (Qp1 and Qp2) are made are the same, except for the differences in the types of conduction in the semiconductor regions (n⁻-type semiconductor region and n⁺-type semiconductor region) which must be formed on n-type well, so we also omit this description.

A first layer of wiring M1 and a second layer of wiring M2 are then formed on the MISFET via an interlayer insulating film, however, the steps in their fabrication and their configuration are omitted.

The present invention has been specifically described above on the basis of an embodiment. This invention is not restricted to the disclosed embodiment; and, various modifications are possible without deviating from the essential points of this invention. In particular, an SRAM memory cell has been used as an example in describing this embodiment. The forms of this embodiment are not limited to an SRAM memory cell; rather, it is widely applicable to semiconductor integrated circuit devices with low power consumption, that are battery-driven, or for which miniaturization is proceeding. In addition, a $CoSi_2$ layer was formed by using a film of Co in this embodiment, however, the metallic silicide layer can be formed by using a film of some other metal. For example, a TiSi layer can be formed by using a film of Ti.

Typical advantages obtained from the invention disclosed in this application are briefly described in the following paragraphs.

With this invention, a depth of 2.5 nm or less is etched away from the surface of semiconductor substrate 1 (source/drain regions) and a Co film is then deposited to form $CoSi_2$ layer 19a, so that the standby current can be reduced. This can improve the yield of products.

Furthermore, a depth of 2.5 nm or less is also etched away from the surface of the gate electrode and a film of Co is deposited to form $CoSi_2$ layer 19a, so that discontinuities in the layer of metallic silicide on the gate electrode can be prevented. This improves the yield of products.

What is claimed is:

1. A method of fabricating a semiconductor integrated circuit device, comprising the steps of:
    (a) forming an isolating element in a semiconductor substrate;
    (b) forming a first insulating film on the semiconductor substrate;
    (c) forming a conductive film on said first insulating film and said isolating element, the conductive film having a width of 0.18 μm or less;
    (d) forming first semiconductor regions in said semiconductor substrate self-aligned with said conductive film;
    (e) forming second insulating films on side surfaces of said conductive film;
    (f) forming second semiconductor regions, having a greater impurity concentration than that of said first semiconductor regions, in said semiconductor substrate, self-aligned with said second insulating films;
    (g) removing the top of said semiconductor substrate to 1 nm–2 nm below the surface of said semiconductor substrate by Ar sputter-etching, and removing the top of said conductive film to 1 nm–2 nm below the surface of the conductive film by Ar sputter-etching; and
    h) forming cobalt silicide layers in said surface of said semiconductor regions and said conductive film,
    wherein said cobalt suicide layers are not in contact with junctions formed by said first semiconductor regions and said semiconductor substrate, and
    wherein said cobalt silicide layers are positioned such that current leakage between said silicide layers and junctions formed by the first semiconductor regions and said semiconductor substrate is prevented.

2. A method of fabricating a semiconductor integrated circuit device, as defined in claim 1, wherein said semiconductor integrated circuit device formed has a standby current of 5.0 μA or below in actual operation.

3. A method of fabricating a semiconductor integrated circuit device, as defined in claim 2, wherein said sputter etching is carried out after the surface of said semiconductor substrate and said conductive film have been cleaned by using hydrofluoric acid as a cleaning agent.

4. A method of fabricating a semiconductor integrated circuit device, as defined in claim 2, wherein said cobalt silicide layers in the surface of said second semiconductor regions have a thickness of 20–40 nm.

5. A method of fabricating a semiconductor integrated circuit device, as defined in claim 2, wherein the top of the conductive film is sputter-etched simultaneously with the sputter-etching away the top of said semiconductor substrate.

6. A method of fabricating a semiconductor integrated circuit device, as defined in claim 2, wherein the top of the semiconductor substrate is removed so as to form a recessed section of the semiconductor substrate.

7. A method of fabricating a semiconductor integrated circuit device, as defined in claim 2, wherein the top of the conductive film is recessed by the sputter-etching thereof.

8. A method of fabricating a semiconductor integrated circuit device, as defined in claim 7, wherein the top of the semiconductor substrate is removed so as to form a recessed section of the semiconductor substrate.

9. A method of fabricating a semiconductor integrated circuit device, as defined in claim 2, wherein the depth of said first semiconductor region is 50 nm or less.

10. A method of fabricating a semiconductor integrated circuit device, as defined in claim 9, wherein the depth of said second semiconductor region is 150 nm or less.

11. A method of fabricating a semiconductor integrated circuit device, as defined in claim 9, wherein said cobalt silicide layers in the surface of said second semiconductor regions have a thickness of 20–40 nm.

12. A method of fabricating a semiconductor integrated circuit device, as defined in claim 2,
wherein said step (a) comprises:
(a1) forming a trench in said semiconductor substrate; and
(a2) depositing a third insulating film in said trench.

13. A method of fabricating a semiconductor integrated circuit device, as defined in claim 2, wherein by said step (g), a height of steps of said conductive film formed over said semiconductor substrate and of said conductive film formed over said isolating element is reduced.

14. A method of fabricating a semiconductor integrated circuit device, defined in claim 2, wherein said second semiconductor regions are formed to a depth of approximately 150 nm from the top of the semiconductor substrate.

15. A method of fabricating a semiconductor integrated circuit device, as defined in claim 2, wherein said second semiconductor regions are formed to a depth of 50 to 150 nm from the top of the semiconductor substrate.

16. A method of fabricating a semiconductor integrated circuit device, as defined in claim 2, wherein in forming the cobalt silicide layers in said surface of said semiconductor regions, the bottom of the cobalt silicide layers is formed to be even.

17. A method of fabricating a semiconductor integrated circuit device, as defined in claim 16, wherein in forming the cobalt silicide layers in said surface of said semiconductor regions, a thickness of the cobalt silicide layers is uniform.

18. A method of fabricating a semiconductor integrated circuit device having a MISFET, comprising the steps of:
(a) forming an isolating element in a semiconductor substrate;
(b) forming a gate insulating film of said MISFET on said semiconductor substrate;
(c) forming a gate electrode of said MISFET on said gate insulating film and on said isolating element, said gate electrode having a width of 0.18 µm or less;
(d) forming first source/drain regions of said MISFET in said semiconductor substrate self-aligned with said gate electrode, a depth of said first source/drain regions being 50 nm or less below the surface of said semiconductor substrate;
(e) forming sidewalls of said MISFET on side surfaces of said gate electrode;
(f) forming second source/drain regions of said MISFET, having a greater impurity concentration than that of said first source/drain regions, in said semiconductor substrate, self-aligned with said sidewalls, a depth of said second source/drain regions being 150 nm or less below the surface of said semiconductor substrate;
(g) cleaning the surface of said semiconductor substrate and the surface of said gate electrode by using hydrofluoric acid as a cleaning agent;
(h) removing the top of said second source/drain regions to 1 nm–2 nm below the surface of said semiconductor substrate by Ar sputter-etching, and removing the top of said gate electrode to 1 nm–2 nm below the surface of the gate electrode by Ar sputter-etching;
(i) depositing a cobalt layer over said gate electrode, and first and second source/drain regions, wherein said steps (h) and (i) take place as sequential processes in a same apparatus; and
(j) forming cobalt silicide layers in said surface of said second source/drain regions and said gate electrode by annealing said cobalt layer,
wherein said cobalt silicide layers are not in contact with junctions formed by said first source/drain regions and said semiconductor substrate, whereby a current leakage between said cobalt silicide layers and said junctions is prevented.

19. A method of fabricating a semiconductor integrated circuit device, as defined in claim 18, wherein said semiconductor integrated circuit device formed has a standby current of 5.0 µA or below in actual operation.

20. A method of fabricating a semiconductor integrated circuit device, as defined in claim 19,
wherein said step (a) comprises:
(a1) forming a trench in said semiconductor substrate; and
(a2) depositing an insulating film in said trench.

21. A method of fabricating a semiconductor integrated circuit device, as defined in claim 19, wherein by said step (h), a height of steps of said gate electrode formed over said semiconductor substrate and of said gate electrode formed over said isolating element is reduced.

22. A method of fabricating a semiconductor integrated circuit device having a MISFET, comprising the steps of:
(a) forming an isolating element in a semiconductor substrate;
(b) forming a gate insulating film of said MISFET on said semiconductor substrate;
(c) forming a gate electrode of said MISFET on said gate insulating film and on said isolating element, a width of said gate electrode being 0.18 µm or less;
(d) forming first source/drain regions of said MISFET in said semiconductor substrate self-aligned with sad gate electrode, a depth of said first source/drain regions being 50 nm or less below the surface of said semiconductor substrate;
(e) forming sidewalls of said MISFET on side surfaces of said gate electrode;

(f) forming second source/drain regions of said MISFET, having a greater impurity concentration than that of said first source/drain regions, in said semiconductor substrate, self-aligned with said sidewalls, a depth of said second source/drain regions being 150 nm or less below the surface of said semiconductor substrate;

(g) removing the top of said second source/drain regions to 1 nm–2 nm below the surface of said semiconductor substrate by Ar sputter-etching, and removing the top of said gate electrode by 1 nm–2 nm below the surface of said gate electrode by Ar sputter-etching; and (h) forming cobalt silicide layers in said surface of said second source/drain regions and said gate electrode, wherein said cobalt silicide layers are not in contact with junctions formed by said first source/drain regions and said semiconductor substrate, thereby a current leakage between said silicide layers and said junctions is prevented.

23. A method of fabricating a semiconductor integrated circuit device, as defined in claim 22, wherein said semiconductor integrated circuit device formed has a standby current of 5.0 µA or below in actual operation.

24. A method of fabricating a semiconductor integrated circuit device, as defined in claim 23, wherein said cobalt silicide layers in the surface of said second semiconductor regions have a thickness of 20–40 nm.

25. A method of fabricating a semiconductor integrated circuit device, as defined in claim 23, wherein the top of the gate electrode is sputter-etched.

26. A method of fabricating a semiconductor integrated circuit device, as defined in claim 23,
wherein said step (a) comprises:
(a1) forming a trench in said semiconductor substrate; and
(a2) depositing an insulating film in said trench.

27. A method of fabricating a semiconductor integrated circuit device, as defined in claim 23, wherein by said step (g), a height of steps of said gate electrode formed over said semiconductor substrate and of said gate electrode formed over said isolating element is reduced.

* * * * *